United States Patent [19]
Ikenoue

[11] Patent Number: 5,278,101
[45] Date of Patent: Jan. 11, 1994

[54] SEMICONDUCTOR DEVICE AND METHOD FOR MANUFACTURING THE SAME

[75] Inventor: Kazuhisa Ikenoue, Tokyo, Japan

[73] Assignee: Kabushiki Kaisha Toshiba, Kawasaki, Japan

[21] Appl. No.: 905,208

[22] Filed: Jun. 26, 1992

Related U.S. Application Data

[62] Division of Ser. No. 531,305, May 31, 1990, abandoned.

[30] Foreign Application Priority Data

Jun. 28, 1989 [JP] Japan ................. 1-163686

[51] Int. Cl.$^5$ .............................. H01L 21/60
[52] U.S. Cl. ...................... 437/217; 437/206; 437/207; 437/209; 437/220
[58] Field of Search .................. 357/70, 72, 74; 437/209, 217, 220, 214, 206, 207

[56] References Cited

U.S. PATENT DOCUMENTS

| | | | |
|---|---|---|---|
| 4,709,468 | 12/1987 | Wilson | 437/209 |
| 4,721,994 | 1/1988 | Mine et al. | 357/70 |
| 4,835,120 | 5/1989 | Mallik et al. | 437/220 |
| 4,891,687 | 1/1990 | Mallik et al. | 357/70 |
| 4,951,122 | 8/1990 | Tsubosaki et al. | 357/72 |
| 4,994,411 | 2/1991 | Naito et al. | 437/217 |
| 5,086,018 | 2/1992 | Conro et al. | 437/220 |

FOREIGN PATENT DOCUMENTS

| | | | |
|---|---|---|---|
| 0354696 | 2/1990 | European Pat. Off. | 357/74 |
| 52-40062 | 3/1977 | Japan | 357/70 |
| 55-56650 | 4/1980 | Japan | 357/70 |
| 1-76741 | 3/1989 | Japan | 357/72 |

OTHER PUBLICATIONS

European Patent Application No. 0 354 696, Date of filing: Jul. 31, 1989; 20 pgs. Application No. 89307740.4; Applicant: Kabushiki Kaisha Toshiba; Inventor: Takahashi, Kenji et al.
European Patent Application No. 0 108 502; Date of filing; Oct. 6, 1983; 22 pgs. Application No. 83306055.1; Applicant: Fujitsu Limited; Inventor: Kubota, Akihiro.
European Search Report No. EP 90 11 0621; 3 pgs.; Examiner: P. W. Zeisler, Date Mar. 16, 1992.

Primary Examiner—Brian E. Hearn
Assistant Examiner—Kevin M. Picardat
Attorney, Agent, or Firm—Banner, Birch, McKie & Beckett

[57] ABSTRACT

A semiconductor device includes a first frame having a bed, a semiconductor chip mounted on the bed and having a bonding pad, a second frame having an inner lead located above the semiconductor chip, a bonding wire connecting the bonding pad of the semiconductor chip to the tip end of the inner lead, and a shock-absorbing layer which is adhered at least to that surface portion of the tip end of the inner lead which faces the semiconductor chip.

5 Claims, 2 Drawing Sheets

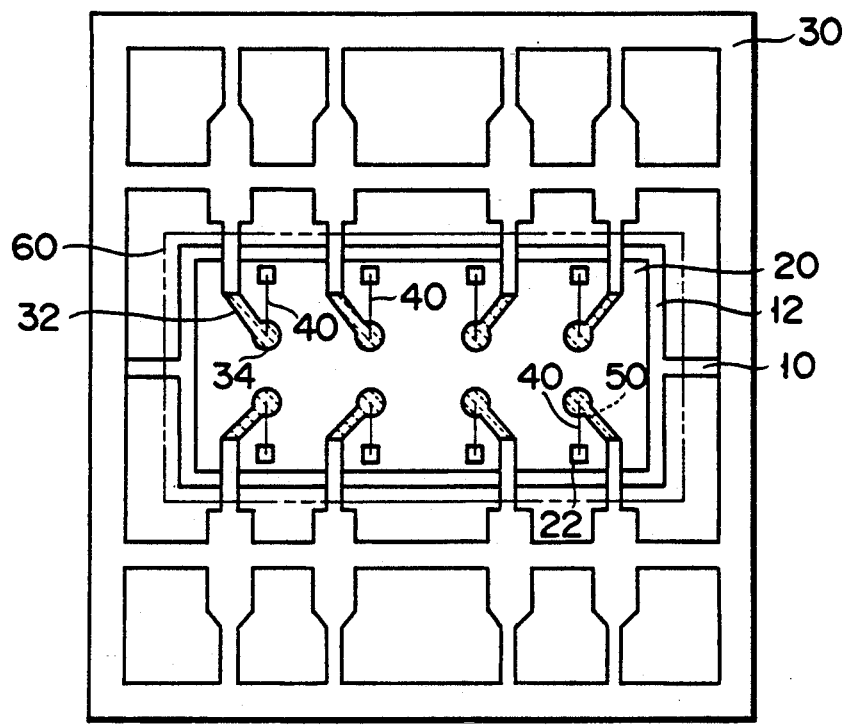
F I G. 1C
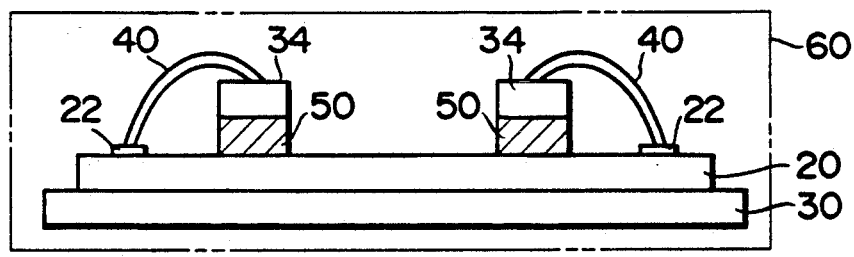
F I G. 1D

SEMICONDUCTOR DEVICE AND METHOD FOR MANUFACTURING THE SAME

This application is a division of Ser. No. 07/531,305, filed May 31, 1990, now abandoned.

BACKGROUND OF THE INVENTION

1. Field of the Invention

The present invention relates to a semiconductor device, wherein a semiconductor chip is mounted on the bed of a first frame, the tip end of each of the inner leads of a second frame is located above the semiconductor chip, and the bonding pads of the semiconductor chip and the inner leads of the second frame are connected together by bonding wires. The present invention also relates to a method for manufacturing this type of semiconductor device.

2. Description of the Related Art

Among well-known semiconductor devices, there is a type wherein a semiconductor chip is mounted on the bed of a first frame, the tip end of each of the inner leads of a second frame is located above the semiconductor chip, and the bonding pads of the semiconductor chip and the inner leads of the second frame are connected together by bonding wires. In this type of semiconductor device, the route extending from one inner lead of the second frame leading to the corresponding bonding pad is long. In the case where this route is long, water enters the interior of the semiconductor device since the route becomes a water route in most cases. Therefore, the above-mentioned type of semiconductor device is advantageous, in that a comparatively small-sized package, formed of sealing resin, can be employed for housing a large-sized chip.

However, the process for manufacturing the above semiconductor device is faced with the problems below.

When the inner leads of the second frame and their corresponding bonding pads are connected together by bonding wires, a passivation film formed on the surface of the semiconductor chip is likely to crack, due to the bonding force. Such a crack degrades the moisture-resisting of the semiconductor device. Moreover, if such a crack is deep, it may happen that semiconductor elements will be destroyed. Under these circumstances, conventional semiconductor devices of the above-mentioned type are not very reliable in operation, and the manufacturing yield of them is not very high.

To solve these problems, the inventor of the present invention considered coating the surface of the semiconductor chip with a shock-absorbing film. To achieve a sufficient shock-absorbing effect, however, the thickness of the film has to be more than a certain value. If the coated film is too thick, it contracts during the coating step. Since, in this case, the wafer coated with the film is subjected to physical stress, it may warp, resulting in damage to it.

The inventor also considered forming a shock-absorbing film on those portions of the second frame which face the semiconductor chip, so as to sufficiently absorb a shock. However, the interface between different materials is likely to become a water route along which water enters the interior of a resin-sealed semiconductor device. Therefore, if the shock-absorbing film is formed on the second frame, not only the interface between the molded resin and the second frame but also the interface between the molded resin and the shock-absorbing film may become a water route. Thus, water may easily enter the interior of a semiconductor device if this semiconductor device has a shock-absorbing film coated on the second frame.

SUMMARY OF THE INVENTION

Accordingly, an object of the present invention is to prevent application of shock, when bonding is performed on a semiconductor chip to fabricate a semiconductor device. Another object of the invention is to improve both the reliability and manufacturing yield of semiconductor devices to be fabricated.

To achieve these objects, the present invention provides a semiconductor device which comprises: a first frame having a bed; a semiconductor chip mounted on the bed and having a bonding pad; a second frame having an inner lead located above the semiconductor chip; a bonding wire connecting the bonding pad of the semiconductor chip to the tip end of the inner lead; and a shock-absorbing layer which is adhered at least to that surface portion of the tip end of the inner lead which faces the semiconductor chip.

The present invention further provides a method for manufacturing a semiconductor device, which comprises the steps of: preparing a plate-like second frame material; applying a sheet-like shock-absorbing layer material to a predetermined portion on one side of the second frame material; punching the second frame material applied with the shock-absorbing layer material into a predetermined shape, to thereby form a second frame having an inner lead and a shock-absorbing layer adhered at least to the tip end of the inner lead; preparing a first frame having a bed; mounting a semiconductor chip having a bonding pad on the bed; adjusting the position of the second frame such that the inner lead of the second frame is located above the semiconductor chip and such that the shock-absorbing layer faces the semiconductor chip; and connecting the bonding pad of the semiconductor chip to the tip end of the inner lead located above the semiconductor chip by means of a bonding wire.

In a semiconductor device thus manufactured, the shock-absorbing layer is formed on that surface portion of the inner lead which faces the semiconductor chip. Since the shock-absorbing layer serves to absorb a shock which may be applied to the semiconductor chip during a bonding operation, the semiconductor chip is prevented from cracking and the semiconductor element is prevented from being damaged. It should be also noted that the shock-absorbing layer is formed only at a portion where it is necessary, and that the shock-absorbing layer is not exposed to the outside after the semiconductor chip is sealed by a sealing resin layer. Since, therefore, the interface between the shock-absorbing layer and a member in contact therewith does not become a water route, electric leakage arising from the provision of the shock-absorbing layer is prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1A through 1D are views illustrating the steps of an example of a process by which to manufacture a semiconductor device of the present invention.

DETAILED DESCRIPTION OF THE PREFERRED EMBODIMENTS

Figure 1A:
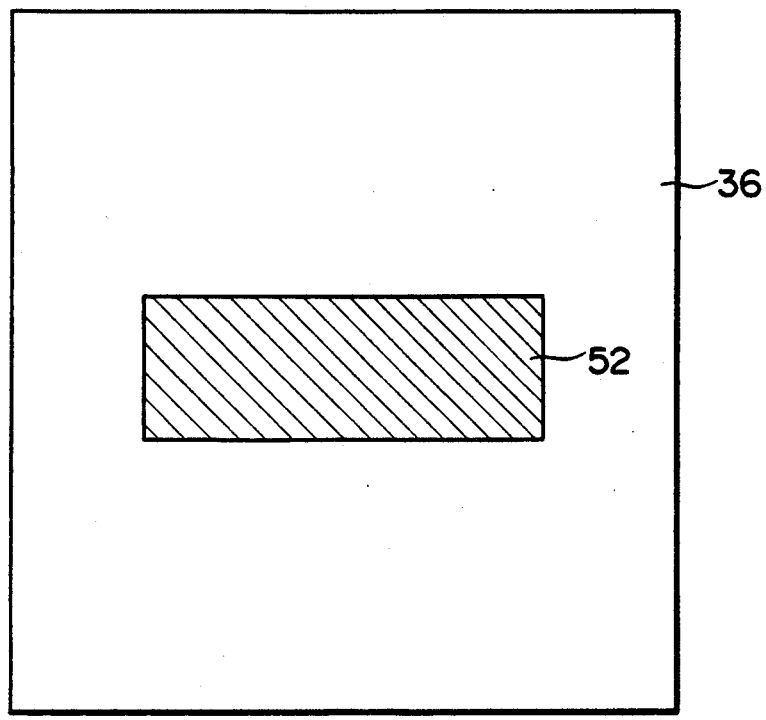

As is shown in FIG. 1A, a plate-like second frame material 36 is prepared. This material 36 is a Fe-Ni alloy such as 42-alloy, Cu, or the like. A sheet-like shock-absorbing layer material 52 is applied to a predetermined portion on one side of the plate-like second frame material 36. Any kind of material may be used as the shock-absorbing layer material 52, as long as it is an electric insulator and can resist such heat as is produced in the heating atmosphere utilized in the manufacturing process of the semiconductor device. As the shock-absorbing layer material 52, epoxy resin may be used, but polyimide resin is more desirable. The thickness of the shock-absorbing layer material 52 is preferably within the range of 30 to 50 μm. The application of the shock-absorbing layer material to the second frame material is carried out, for example, by the adhesion used in a printing process.

Figure 1B:
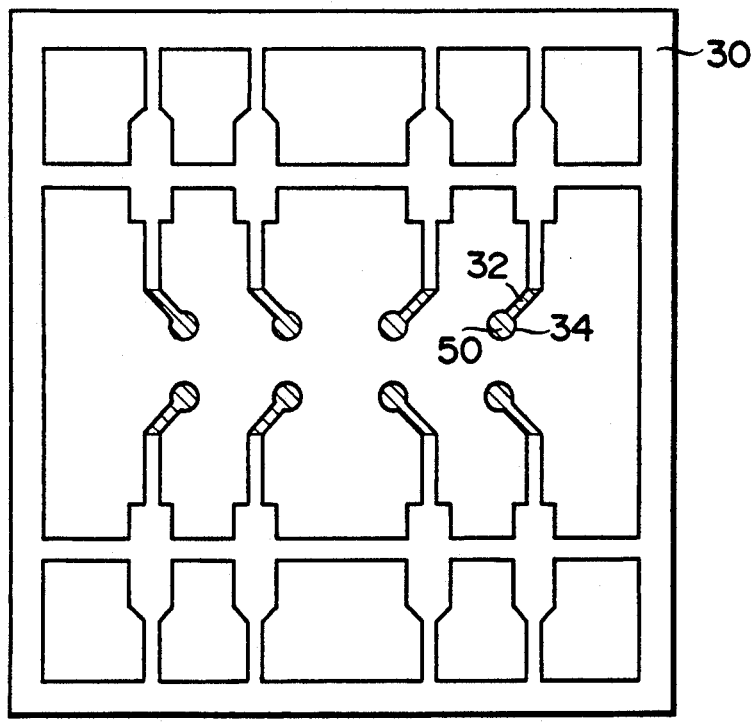

The second frame material 36, applied with the shock-absorbing layer material 52, is punched into a predetermined shape, to thereby form a second frame 30 (which is indicated by the oblique lines in the Figures). As is shown in FIG. 1B, the second frame 30 has inner leads 32 and shock-absorbing layers 5 adhered at least to the tip end 34 of each inner lead 32. The second frame material 36 is punched from the side to which the shock-absorbing layer material 52 is applied, since the punching from this side leaves no burr.

Next, a first frame 10 having a bed 12 is prepared, as is shown in FIG. 1C. A semiconductor chip 20 having bonding pads 22 is mounted on the bed 12. In this condition, the position of the second frame 30 is adjusted such that the inner leads 32 of the second frame 30 are located above the semiconductor chip 20 and such that the shock-absorbing layers 50 face the surface of the semiconductor chip 20. After the position of the second frame 30 is adjusted in this manner, the first frame 10 and the second frame 30 are bonded together by spot welding. Thereafter, the bonding pads 22 of the semiconductor chip 20 are connected, by means of bonding wires 40, to the tip ends 34 of the corresponding inner leads 32 of the second frame 30 which is located above the semiconductor chip 20.

Finally, a sealing resin layer 60 is provided for the region indicated by the two-dot-dash lines in the Figures. By this sealing resin layer, the first frame 10, the semiconductor chip 20, the second frame 30, the bonding wires 40, and the shock-absorbing layers 50 are sealed and secured.

As is shown in FIGS. 1C and 1D, a semiconductor device manufactured in the above-mentioned manner comprises: a first frame 10 having a bed 12; a semiconductor chip 20 mounted on the bed 12 and having a bonding pad 22; a second frame 30 having a inner lead located above the semiconductor chip 20; a bonding wire 40 connecting the bonding pad 22 of the semiconductor chip 20 to the tip end 34 of the inner lead 32; and a shock-absorbing layer 50 which is adhered at least to that surface portion of the tip end 3 of the inner lead 32 which faces the semiconductor chip 20.

Additional advantages and modifications will readily occur to those skilled in the art. Therefore, the invention in its broader aspects is not limited to the specific details, representative devices, and illustrated examples shown and described herein. Accordingly, various modifications may by without departing from the spirit or scope of the general inventive concept as defined by the appended claims and their equivalents.

What is claimed is:

1. A method for manufacturing a semiconductor device comprising the steps of:
   preparing a plate-like second frame material;
   applying a shock-absorbing film layer to a predetermined portion on one side of the second frame material;
   punching the second frame material, applied with the shock-absorbing film layer, into a predetermined shape, to thereby form a second frame having an inner lead and a shock-absorbing film layer applied at least to the tip end of the inner lead;
   preparing a first frame having a bed;
   mounting a semiconductor chip having a bonding pad on the bed;
   adjusting the position of the second frame such that the inner lead of the second frame is located above the semiconductor chip and such that the shock-absorbing film layer faces the surface of the semiconductor chip; and
   connecting the bonding pad of the semiconductor chip to the tip end of the inner lead located above the semiconductor chip by a bonding wire.

2. A method according to claim 1, wherein said applying step includes a step of adhering the shock-absorbing film layer to the second frame material by printing.

3. A method according to claim 1, further comprising a step of resin-sealing the first frame, the semiconductor chip, the second frame, the bonding wire, and the shock-absorbing film layer.

4. A method according to claim 1, wherein said punching step includes a step of punching the second frame material from the side to which the shock-absorbing film layer is applied.

5. A method according to claim 1, wherein the step of punching the second frame material includes punching the second frame material to form a second frame having at least one inner lead with a shock-absorbing film layer applied at least to the tip end of the inner lead, each respective shock-absorbing film layer being separate from all other shock-absorbing film layers applied at least to the tip end of an inner lead.

* * * * *